(12) United States Patent
Wu (10) Patent No.: US 11,509,313 B1
(45) Date of Patent: Nov. 22, 2022

(54) DELAY-LOCKED LOOP CIRCUIT WITH MULTIPLE MODES

(71) Applicant: Fujian Jinhua Integrated Circuit Co., Ltd., Quanzhou (CN)

(72) Inventor: Chen-Feng Wu, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/684,373

(22) Filed: Mar. 1, 2022

(30) Foreign Application Priority Data

| Dec. 3, 2021 | (CN) | 202111464877.2 |
| Dec. 3, 2021 | (CN) | 202111465058.X |
| Dec. 3, 2021 | (CN) | 202123024077.7 |
| Dec. 3, 2021 | (CN) | 202123025865.8 |

(51) Int. Cl.
*H03L 7/081* (2006.01)

(52) U.S. Cl.
CPC .................................. *H03L 7/0814* (2013.01)

(58) Field of Classification Search
CPC .................................................... H03L 7/0814
See application file for complete search history.

(56) References Cited

U.S. PATENT DOCUMENTS

| 7,216,249 | B2* | 5/2007 | Fujiwara | G06F 1/06 331/46 |
| 9,007,109 | B2* | 4/2015 | Ba | H03L 7/093 375/376 |
| 9,698,798 | B1* | 7/2017 | Fredenburg | H03L 7/099 |
| 11,070,216 | B2* | 7/2021 | Candler | H03L 7/085 |
| 2010/0073048 | A1* | 3/2010 | Ke | H03L 7/093 327/157 |
| 2013/0120036 | A1* | 5/2013 | Zhu | H03L 7/0802 327/156 |
| 2016/0204787 | A1* | 7/2016 | Lotfy | G04F 10/005 327/159 |
| 2020/0076439 | A1* | 3/2020 | Weeks | H03L 7/0805 |

FOREIGN PATENT DOCUMENTS

CN          113346900 A * 9/2021 ............. H03L 7/093

* cited by examiner

*Primary Examiner* — Adam D Houston
(74) *Attorney, Agent, or Firm* — Winston Hsu (57) ABSTRACT

A DLL circuit comprising a delay circuit, a phase detector and a counting control circuit. The delay circuit is configured to receive a reference clock signal, and delay the reference clock signal to output a delayed clock signal. The phase detector is configured to detect a phase difference between the reference clock signal and the delayed clock signal to generate a phase difference signal. The counting control circuit is configured to generate a control delay signal according to the phase difference signal. The delay circuit delays the reference clock signal according to the control delay signal to output the delayed clock signal. When the counting control circuit is in the first mode, the counting control circuit has a first update frequency. When the counting control circuit is in the second mode, the counting control circuit has a second update frequency.

20 Claims, 6 Drawing Sheets

DELAY-LOCKED LOOP CIRCUIT WITH MULTIPLE MODES

BACKGROUND OF THE INVENTION

1. Field of the Invention

The present invention relates to a delay-locked loop (DLL) circuit, and more particularly, to a delay-locked loop (DLL) circuit with multiple modes.

2. Description of the Prior Art

According to current dynamic random access memory (DRAM) specifications, DRAM products (especially the Double-Data-Rate Fourth Generation (DDR4) memory) need better voltage power stability. For faster and faster transmission speeds, even small power changes can cause jittering of the output data and further affect the eye diagram of the output data. When the eye diagram of the output data is bad, the system cannot read the correct data, such that errors of the system may occur. Therefore, in the field of high transmission speed, the delay-locked loop (DLL) circuit needs to be improved to make the data jittering less. Generally, the DLL circuit uses the phase detector to make decision, and adjusts the delay amount by using the counting control circuit. The consecutive auto-refresh command will cause the DLL circuit to consume a lot of current. Such a large current consumption change will cause the change of the internal power supply voltage, and when the DLL circuit switches from refreshing to reading data, the output signal may have a negative delay. Furthermore, the period and step of the counting control circuit of the typical DLL circuit are fixed, and cannot be adjusted quickly to adapt to large changes of delay. For example, when a read command is received, the data may not be aligned with the clock signal, such that jittering may occur. In addition, to reduce jittering during data reading, different command sequences or different data reading modes will actually result in different internal voltage states. For example, a bank active command before reading will consume a lot of current, so a time signal (such as a tAC signal) will cause a lot of delay at the beginning, and jittering is generated when the delay is locked. Therefore, there is a need for a novel method and associated architecture to reduce delay jittering and current variation for solving the problems without introducing any side effect or in a way that is less likely to introduce a side effect.

SUMMARY OF THE INVENTION

One of the objectives of the present invention is to provide a delay-locked loop (DLL) circuit with multiple modes may effectively change the period and step according to different requirements, to solve the aforementioned problem.

At least one embodiment of the present invention provides a delay-locked loop (DLL) circuit comprising a delay circuit, a phase detector and a counting control circuit. The delay circuit is configured to receive a reference clock signal from outside of the DLL circuit, and delay the reference clock signal to output a delayed clock signal. The phase detector is configured to receive the reference clock signal and the delayed clock signal, and detect a phase difference between the reference clock signal and the delayed clock signal to generate a phase difference signal. The counting control circuit is configured to receive the phase difference signal and generate a control delay signal according to the phase difference signal. The delay circuit delays the reference clock signal according to the control delay signal to output the delayed clock signal. The counting control circuit has a first mode and a second mode. When the counting control circuit is in the first mode, the counting control circuit has a first update frequency. When the counting control circuit is in the second mode, the counting control circuit has a second update frequency. The first update frequency is lower than the second update frequency.

Compared with the prior art, the counting control circuit of the DLL circuit of the present invention has multiple modes (including a first mode and a second mode). The DLL circuit can quickly lock the delay through the second mode, and there is no negative delay in the output signal when the data is read. When an external circuit reads data, the DLL circuit switches to the first mode to reduce the delay jittering that is not conducive to data reading. Furthermore, when the DLL circuit is on standby, a mode with a lower update frequency can also be selected to reduce current consumption. According to this arrangement, the DLL circuit of the present invention can achieve the delay lock more quickly, and effectively reduce the delay jitter and the variation of current consumption.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
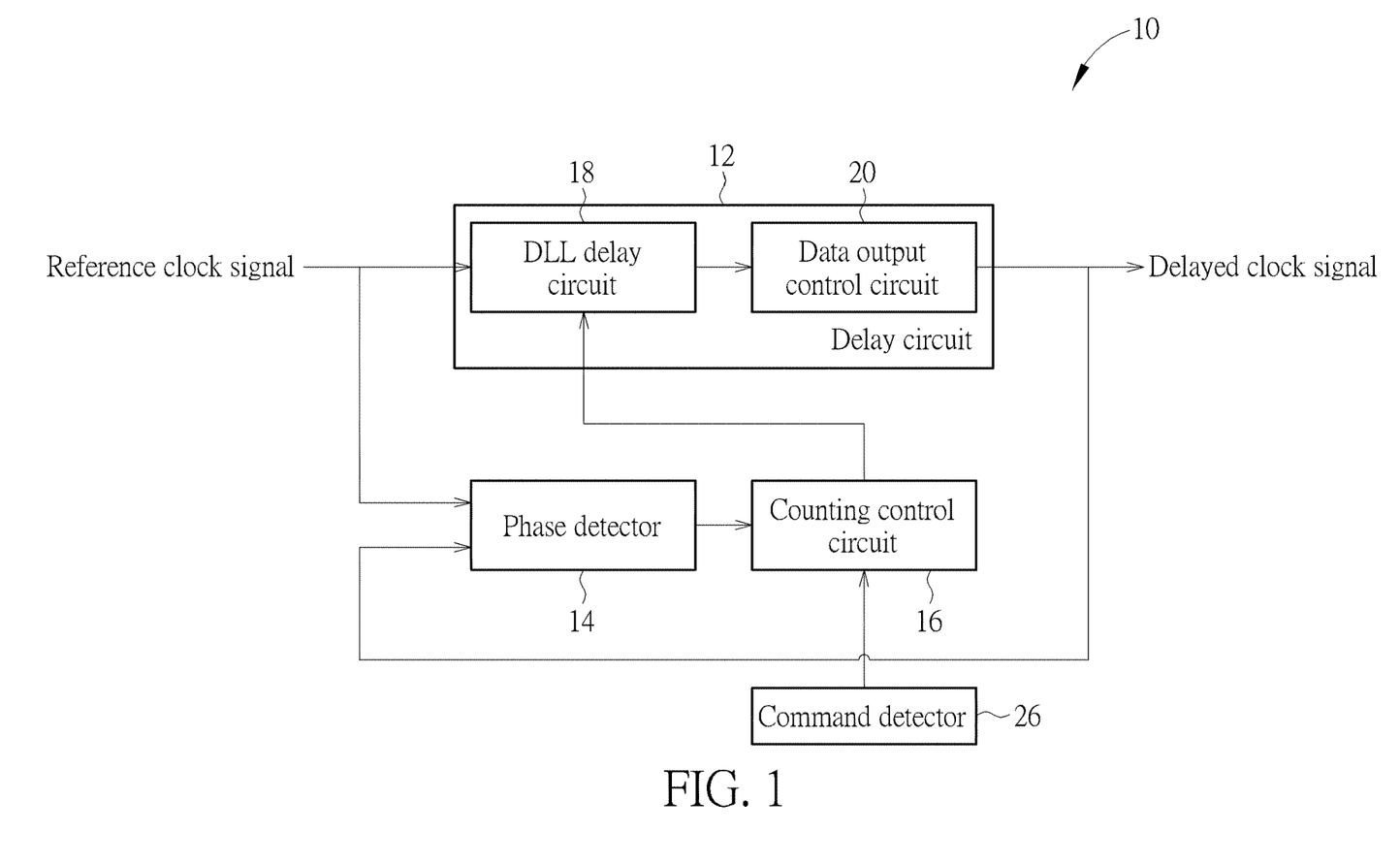
FIG. 1 is a diagram illustrating a delay-locked loop (DLL) circuit according to a first embodiment of the present invention.

Please refer to FIG. 1. FIG. 1 is a diagram illustrating a delay-locked loop (DLL) circuit 10 according to a first embodiment of the present invention. As shown in FIG. 1, the DLL circuit 10 of the first embodiment includes a delay circuit 12, a phase detector 14 and a counting control circuit 16. The delay circuit 12 is used to receive a reference clock signal (e.g., a reference clock signal of a dynamic random access memory (DRAM)) from outside of the DLL circuit 10, and delay the reference clock signal to output a delayed clock signal. The delayed clock signal can be output to a clock tree (e.g., a clock tree of a DRAM), and then output the delayed clock signal through an output driving circuit from the clock tree. The phase detector 14 is configured to receive the reference clock signal and the delayed clock signal, and to detect a phase difference between the reference clock signal and the delayed clock signal, in order to generate a phase difference signal according to the phase difference. The counting control circuit 16 is configured to receive the phase difference signal and generate a control delay signal according to the phase difference signal. The delay circuit 12 delays the reference clock signal according to the control delay signal, to output a delayed clock signal. For example, the delay circuit 12 comprises a DLL delay circuit 18 and a data output control circuit 20. The DLL delay circuit 18 is configured to receive the control delay signal and delay the reference clock signal according to the control delay signal, and the data output control circuit 20 is configured to output the delayed clock signal. The counting control circuit 16 has a first mode and a second mode, and may switch between the first mode and the second mode according to requirements of commands from outside of the DLL circuit 10. The difference between the first mode and the second mode is that at least one of the update frequency and the delay step of one mode are different from that of the other mode. For example, when the counting control circuit 16 is in the first mode, it has a first update frequency and a first delay step; and when the counting control circuit 16 is in the second mode, it has a second update frequency and a second delay step, where the first update frequency is lower than the second update frequency, and the first delay step is not greater than the second delay step. In addition, the DLL circuit 10 may further comprise a command detector 26 connected to the counting control circuit 16. The DLL circuit 10 detects an external circuit command through the command detector 26. The command detector 26 may be implemented by a logic circuit.

Figure 2:
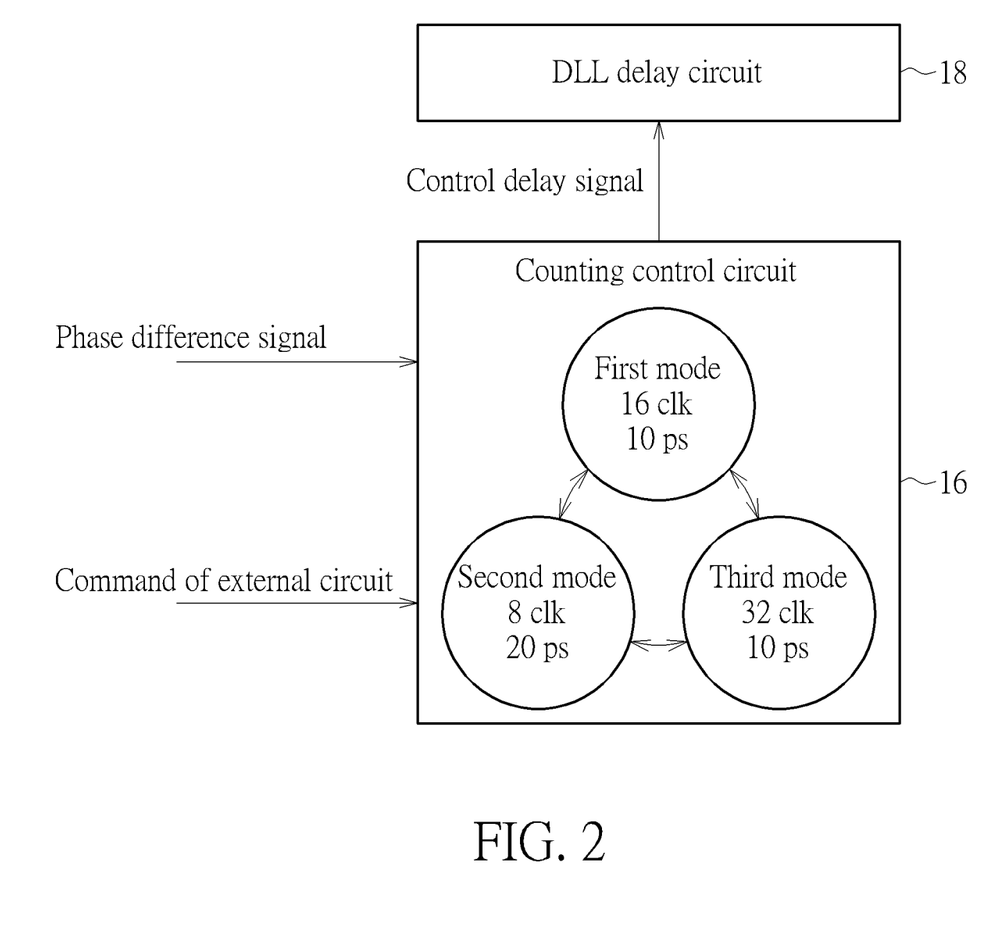
FIG. 2 is a diagram illustrating a counting control circuit with multiple modes according to the first embodiment of the present invention.

Please refer to FIG. 2. FIG. 2 is a diagram illustrating a counting control circuit 16 with multiple modes according to the first embodiment of the present invention. As shown in FIG. 2, the counting control circuit 16 receives the phase difference signal, and generates the control delay signal according to the phase difference signal, where the control delay signal can control the update frequency and the delay step of the DLL delay circuit 18. In other words, the DLL delay circuit 18 can adjust its update frequency and delay step according to the control delay signal. Furthermore, the counting control circuit 16 is further used to receive commands from an external circuit, and switches between the first mode and the second mode according to the commands from the external circuit. For example, when a command from an external circuit received by the counter control circuit 16 is a lock command, the counting control circuit 16 is controlled to be in the second mode, and the counting control circuit 16 has a second update frequency and a second delay step. The counting control circuit 16 then controls the DLL delay circuit 18 to use the second update frequency and the second delay step to perform the delay lock operation through the control delay signal, where the second update frequency may be higher than the first update frequency, and the second delay step may be not less than the first delay step. For example, the second update frequency is to update the delay once after the edge of the reference clock signal occurs 8 times (labeled as "8 clk" in FIG. 2 for brevity), and the second delay step is to delay 20 picoseconds for each update (labeled as "20 ps" in FIG. 2 for brevity). For another example, when the command of the external circuit received by the counting control circuit 16 is a read start command, the counting control circuit 16 is controlled to be in the first mode, such that the counting control circuit 16 has a first update frequency and a first delay step. Similarly, the counting control circuit 16 controls the DLL delay circuit 18 through the control delay signal to use the first update frequency and the first delay step to perform delay lock operation. The first update frequency can be lower than the second update frequency, and the first delay step can be not greater than the second delay step. For example, the first update frequency is to update the delay once after the edge of the reference clock signal occurs 16 times (labeled as "16 clk" in FIG. 2 for brevity), and the first delay step is to delay 10 picoseconds for each update (labeled as "10 ps" in FIG. 2 for brevity).

In addition, the counting control circuit 16 can dynamically adjust the modes, the multiple modes can include more than two modes, and at least one of the update frequency and the delay step in one mode is different from that in other modes. For example, when the command of the external circuit received by the counting control circuit 16 is a standby command, the counting control circuit 16 is controlled to be in a third mode, such that the counting control circuit 16 has a third update frequency and a third delay step. Similarly, the counting control circuit 16 controls the DLL delay circuit 18 through the control delay signal to use the third update frequency and the third delay step to perform delay lock operation. The third update frequency is to update the delay once after the edge of the reference clock signal occurs 32 times (labeled as "32 clk" in FIG. 2 for brevity), and the third delay step is the same as the first delay step to delay 10 picoseconds for each update (labeled as "10 ps" in FIG. 2 for brevity).

Figure 3:
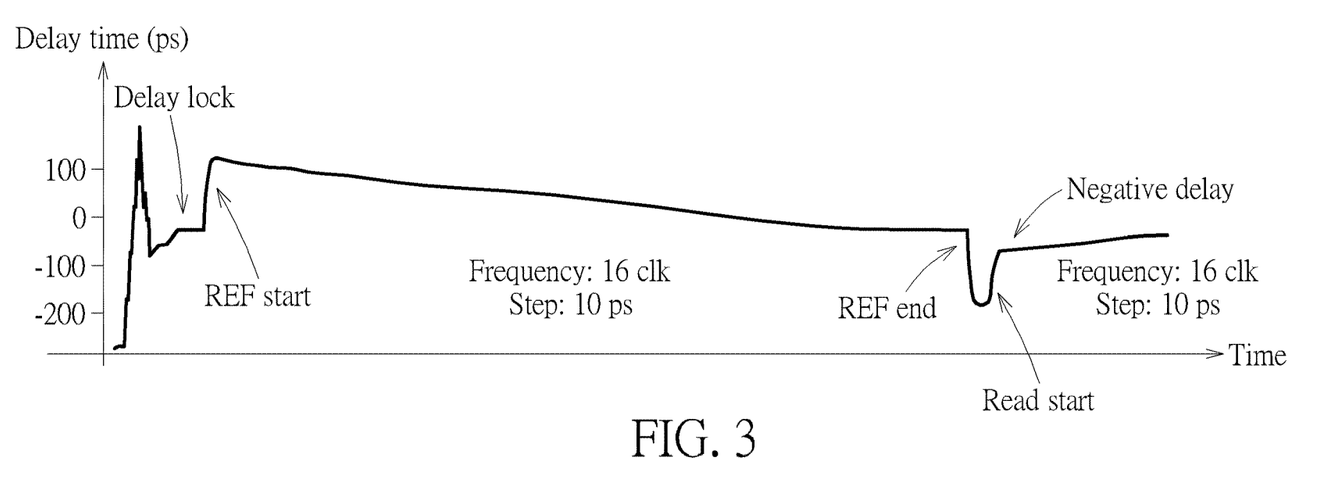
FIG. 3 is a waveform diagram illustrating a delayed clock signal output by the DLL circuit in different modes according to the first embodiment of the present invention.
Figure 4:
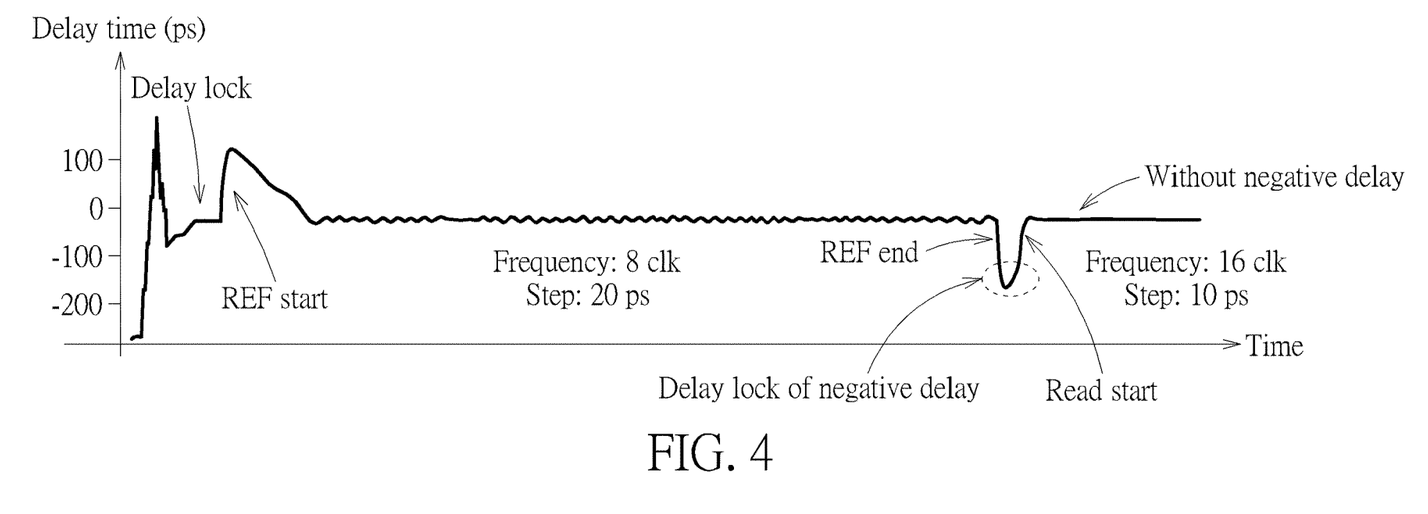
FIG. 4 is a waveform diagram illustrating a delayed clock signal output by the DLL circuit in different modes according to the first embodiment of the present invention.

According to the above arrangement, the DLL circuit 10 of the present invention can adjust different modes to have different update frequencies and delay steps according to the requirements of commands of the external circuit. For example, when the command of the external circuit received by the counting control circuit 16 is a standby command, the update frequency is adjusted to a lower update frequency (such as to update the delay once after the edge of the reference clock signal occurs 32 times) to reduce the power consumed by the DLL circuit 10. Furthermore, the corresponding update frequencies and delay steps can also be set for the first mode of the read start command and the second mode of the lock command. Please refer to FIG. 3 in conjunction with FIG. 4. FIG. 3 and FIG. 4 are waveform diagrams illustrating a delayed clock signal output by the DLL circuit in different modes according to the first embodiment of the present invention.

As shown in FIG. 3, after the DLL circuit 10 is delay-locked, the external circuit refreshes the delay state. At this time, the delayed clock signal will be delayed from the reference clock signal for a longer period of time (e.g., 150 picoseconds). In FIG. 3, the DLL circuit 10 uses the update frequency to update the delay once after the edge of the reference clock signal occurs 16 times (labeled as "16 clk" in FIG. 3 for brevity), and the delay step is to delay 10 picoseconds for each update (labeled as "10 ps" in FIG. 3 for brevity). After a period of time, the DLL circuit 10 locks the delay of the delayed clock signal. At this time, the external circuit enters a data reading state, and the delayed clock signal will have a negative delay (that is, ahead of the reference clock signal). The DLL circuit 10 also uses the update frequency to update the delay once after the edge of the reference clock signal occurs 16 times (labeled as "16 clk" in FIG. 3 for brevity), and the delay step is to delay 10 picoseconds for each update (labeled as "10 ps" in FIG. 3 for brevity), such that the negative delay of the delayed clock signal can be slowly adjusted to be delay-locked. The greater the negative delay at the beginning of reading the data is, the more is the delay jitter.

As shown in FIG. 4, similarly, after the DLL circuit 10 is delay-locked, the external circuit refreshes the delay state. At this time, the delayed clock signal will be delayed from the reference clock signal for a longer period of time. However, when the counting control circuit 16 receives a lock command, the counting control circuit 16 is controlled to be in the second mode, such that the counting control circuit 16 has a second update frequency and a second delay step. The second update frequency is to update the delay once after the edge of the reference clock signal occurs 8 times (labeled as "8 clk" in FIG. 4 for brevity), and the second delay step is to delay 20 picoseconds for each update (labeled as "20 ps" in FIG. 4 for brevity). Compared with FIG. 3, the update frequency and the delay step of the second mode allows the delay of the delayed clock signal to be locked in a shorter time. It should be noted that the delay locking in the second mode will produce jittering due to the higher update frequency and larger delay step. However, this jittering has a greater impact only in the state of reading data, and the effect of jittering in the refresh state is small. After the refresh is over, the external circuit enters the data reading state, and the delayed clock signal has a negative delay. Since the delay locking in the second mode has a higher update frequency and a larger delay step, the negative delay is delay-locked quickly. After the data reading starts, the counting control circuit 16 receives a read start command, and the counting control circuit 16 is controlled to be in the first mode, such that the counting control circuit 16 has a first update frequency and a first delay step. The first update frequency is to update the delay once after the edge of the reference clock signal occurs 16 times (labeled as "16 clk" in FIG. 4 for brevity), and the first delay step is to delay 10 picoseconds for each update (labeled as "10 ps" in FIG. 4 for brevity). By switching to the first mode, the delayed clock signal which is delay-locked can be maintained without jittering, in order to facilitate the external circuit to read data.

According to the above arrangement, the counting control circuit of the DLL circuit of the present invention has multiple modes (which include a first mode and a second mode). The DLL circuit can quickly lock the delay through the second mode, and there is no negative delay in the output signal when the data is read. When an external circuit reads data, the DLL circuit switches to the first mode to reduce the delay jittering that is not conducive to data reading. Furthermore, when the DLL circuit is on standby, a mode with a lower update frequency can be selected to reduce current consumption. According to this arrangement, the DLL circuit of the present invention can achieve the delay locking more quickly, and effectively reduce the delay jitter and the variation of current consumption.

Figure 5:
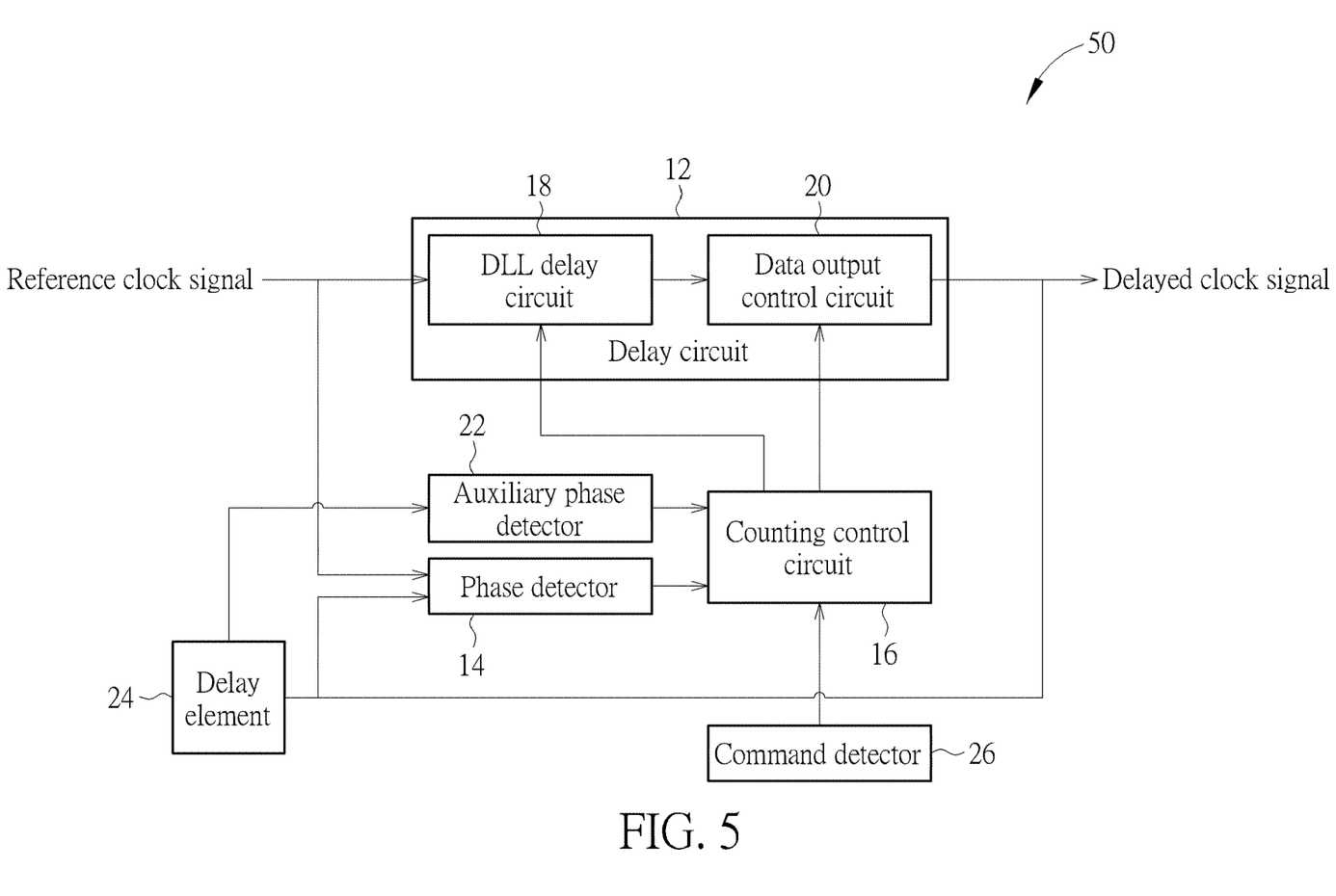
FIG. 5 is a diagram illustrating a DLL circuit according to a second embodiment of the present invention.

Regarding the large amount of current consumption, delay and jittering caused by bank active command before reading, the present invention provides a second embodiment to solve related problems. Please refer FIG. 5. FIG. 5 is a diagram illustrating a DLL circuit 50 according to a second embodiment of the present invention. As shown in FIG. 5, the DLL circuit 50 includes a delay circuit 12, a phase detector 14, a counting control circuit 16, an auxiliary phase detector 22 and a delay element 24. The delay circuit 12 is used to receive a reference clock signal from an external circuit (e.g., a reference clock signal of a dynamic random access memory (DRAM)), and delay the reference clock signal to output a delayed clock signal. The delayed clock signal can be output to a clock tree (e.g., a clock signal tree of a DRAM), and then the delayed clock signal is output from the clock signal tree through an output driving circuit. The phase detector 14 is configured to receive the reference clock signal and the delayed clock signal, and detect a phase difference between the reference clock signal and the delayed clock signal to generate a phase difference signal. The delay element 24 is configured to delay the delayed clock signal by a predetermined time (e.g., 30 picoseconds), and the auxiliary phase detector 22 is configured to receive the delayed clock signal delayed by the predetermined time, and detect the delayed clock signal which is delayed by the predetermined time to generate a determining signal. The counting control circuit 16 is configured to receive the phase difference signal and the determining signal, and generate a control delay signal and a time shift control signal according to the phase difference signal and the determining signal. The delay circuit 12 delays the reference clock signal according to the control delay signal to output a delayed clock signal. For example, the delay circuit 12 includes a DLL delay circuit 18 and a data output control circuit 20. The DLL delay circuit 18 is configured to receive the control delay signal, and delay the reference clock signal according to the control delay signal. The data output control circuit 20 is configured to receive the time shift control signal and output the delayed clock signal. The delayed clock signal is configured to control the data output control circuit to perform a shift operation on the delayed clock signal. The counting control circuit 16 has a first mode and a second mode, and can switch between the first mode and the second mode according to the requirement of a command of the external circuit, the phase difference signal and the determining signal. The difference between the first mode and the second mode is that at least one of the update frequency and the delay step of one mode is different from that of the other mode. For example, when the counting control circuit 16 is in the first mode, it has a first update frequency and a first delay step; and when the counting control circuit 16 is in the second mode, it has a second update frequency and a second delay step, where the first update frequency is lower than the second update frequency, and the first delay step is not greater than the second delay step. In addition, the DLL circuit 50 may further include a command detector 26 connected to the counting control circuit 16. The DLL circuit 50 detects a command of the external circuit by the command detector 26. For example, the command detector 26 may be implemented by a logic gate circuit.

Figure 6:
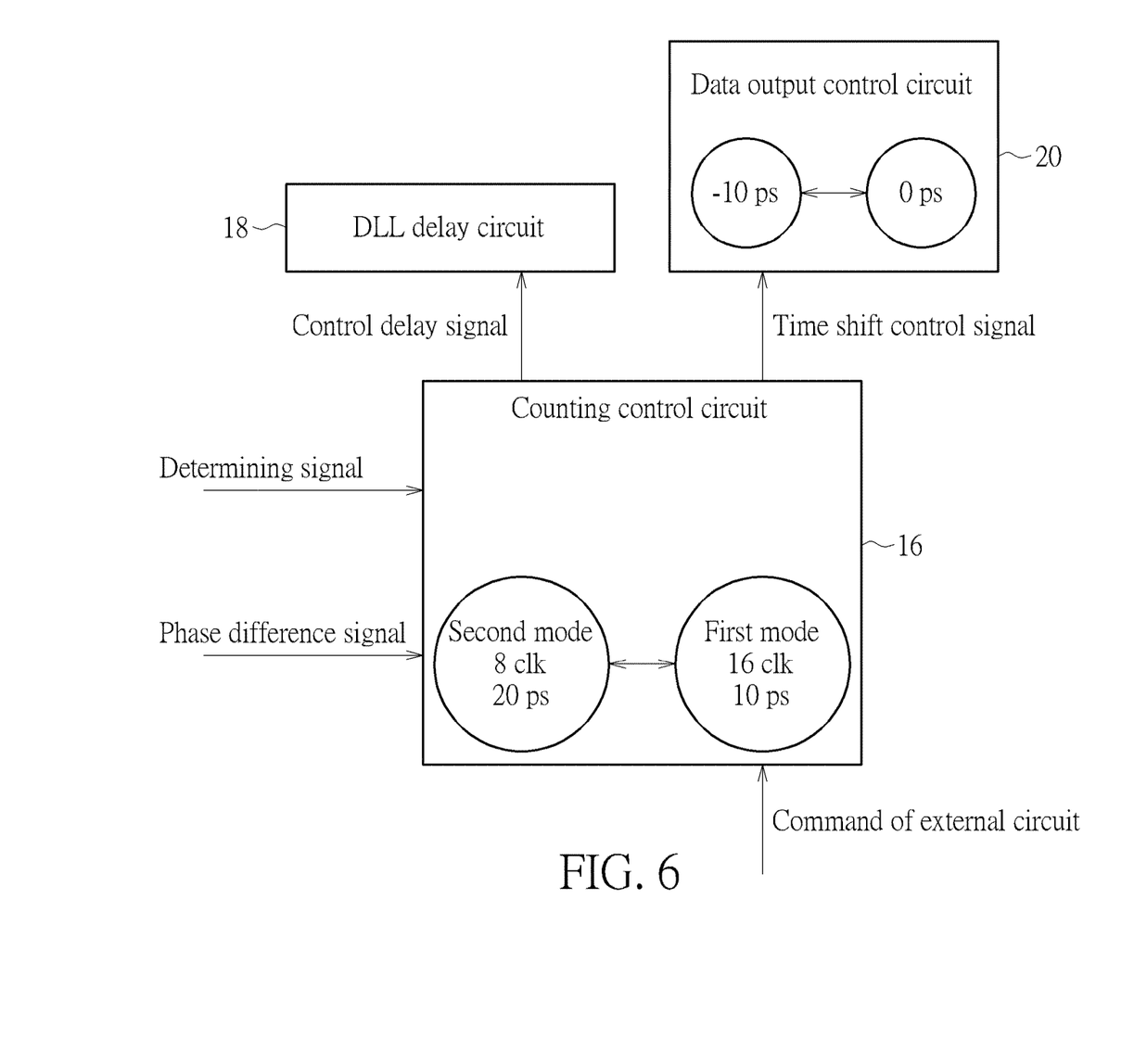
FIG. 6 is a diagram illustrating a counting control circuit with multiple modes according to the second embodiment of the present invention.

Please refer to FIG. 6. FIG. 6 is a diagram illustrating a counting control circuit 16 with multiple modes according to the second embodiment of the present invention. As shown in FIG. 6, the counting control circuit 16 receives the phase difference signal and the determining signal, and generates the control delay signal according to the phase difference signal and the determining signal, where the control delay signal can control the update frequency and the delay step of the DLL delay circuit 18. Furthermore, the counting control circuit 16 also generates the time shift control signal according to the phase difference signal and the determining signal. In other words, the DLL delay circuit 18 can adjust its update frequency and delay step according to the control delay signal and the determining signal. The data output control circuit 20 can perform a shift operation on the delayed clock signal according to the control delay signal and the determining signal. Furthermore, the counting control circuit 16 is further configured to receive a command of an external circuit through the command detector 26, and switch between the first mode and the second mode according to the command of the external circuit. For example, when the command of the external circuit received by the counter control circuit 16 is a read start command, the counting control circuit 16 is controlled to be in the second mode, and the counter control circuit 16 has a second update frequency and a second delay step. The counting control circuit 16 controls the DLL delay circuit 18 through the control delay signal, such that the DLL delay circuit 18 is controlled to use the second update frequency and the second delay step to perform delay lock operation. The second update frequency may be higher than the first update frequency, and the second delay step length can be not less than the first delay step. For example, the second update frequency is to update the delay once after the edge of the reference clock signal occurs 8 times (labeled as "8 clk" in FIG. 6 for brevity), and the second delay step is to delay 20 picoseconds for each update (labeled as "20 ps" in FIG. 6 for brevity). For another example, when the determining signal indicates that the phase difference of the delayed clock signal is less than the predetermined time (e.g., 30 picoseconds), the counting control circuit 16 is controlled to be in the first mode, such that the counting control circuit 16 has the first update frequency and the first delay step. Similarly, the counting control circuit 16 controls the DLL delay circuit 18 through the control delay signal, such that the DLL delay circuit 18 is controlled to use the first update frequency and the first delay step to perform delay lock operation. The first update frequency can be lower than the second update frequency, and the first delay step can be not greater than the second delay step. For example, the first update frequency is to update the delay once after the edge of the reference clock signal occurs 16 times (labeled as "16 clk" in FIG. 6 for brevity), and the first delay step is to delay 10 picoseconds for each update (labeled as "10 ps" in FIG. 6 for brevity). Furthermore, the counting control circuit 16 performs a shift operation by sending the time shift control signal to the data output control circuit 20, and the shift operation can switch between applying a forward time shift of 10 picoseconds (label as "−10 ps" in FIG. 6 for brevity) to the output delayed clock signal and applying a time shift of 0 picoseconds (label as "0 ps" in FIG. 6 for brevity) to the output delayed clock signal.

Figure 7:
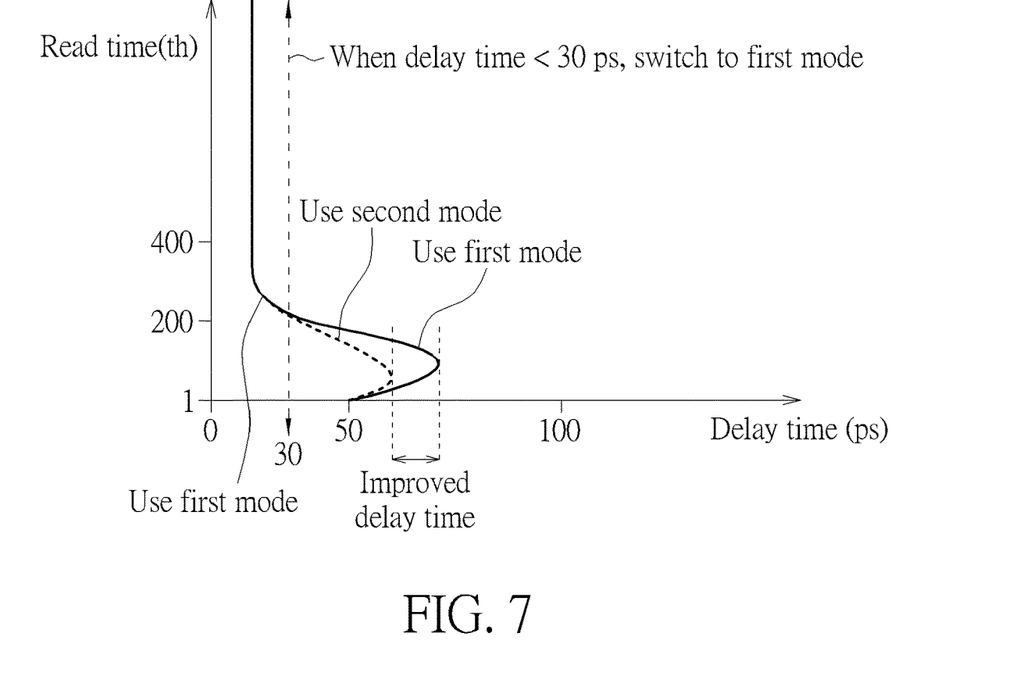
FIG. 7 is a waveform diagram illustrating a delayed clock signal output by the DLL circuit in different modes according to the second embodiment of the present invention.

According to the above arrangement, the DLL circuit 50 of the present invention can switch between different modes to have different update frequencies and delay steps according to the control delay signal, the determining signal and the commands of the external circuit. Please refer to FIG. 7. FIG. 7 is a waveform diagram illustrating a delayed clock signal output by the DLL circuit 50 in different modes according to the second embodiment of the present invention. As shown in FIG. 7, assuming that the external circuit starts to read data after a bank active command, the delayed clock signal is delayed from the reference clock signal for a longer period of time (e.g., 80 picoseconds). FIG. 7 shows the difference between the DLL circuit 50 using the first mode and the DLL circuit 50 using the second mode. For example, when the DLL circuit 50 receives a read start command, the counting control circuit 16 is controlled to be in the second mode, such that the counting control circuit 16 has the second update frequency (such as to update the delay once after the edge of the reference clock signal occurs 8 times) and the second delay step (such as to delay 20 picoseconds for each update). As a result, the delay time of the delayed clock signal can be gradually locked with a small number of reading times. Compared with the first mode, the update frequency and delay step of the second mode allows the delay of the delayed clock signal to be locked in a shorter time. It should be noted that the delay locking in the second mode will produce jittering due to the higher update frequency and larger delay step. However, the jitter has a greater impact only in the state of reading data, such that the influence of delay jittering is small when reading is just started. In other words, when the counting control circuit 16 is controlled to be in the second mode, the delay time can be reduced more quickly compared with the first mode, such that the delay time after receiving the read start command is reduced. As a result, the improved delay time can make the eye diagram of the output data better, which enables the entire circuit to handle higher speed data reading and writing. In addition, when the delay time of the delayed clock signal is less than the predetermined time (e.g., 30 picoseconds), the counting control circuit 16 is controlled to be in the first mode, such that the counting control circuit 16 has the first update frequency (such as to update the delay once after the edge of the reference clock signal occurs 16 times) and the second delay step (such as to delay 10 picoseconds for each update). By switching to the first mode, the delayed clock signal which is delay locked can be maintained without jittering, in order to facilitate the external circuit to read data.

Figure 8:
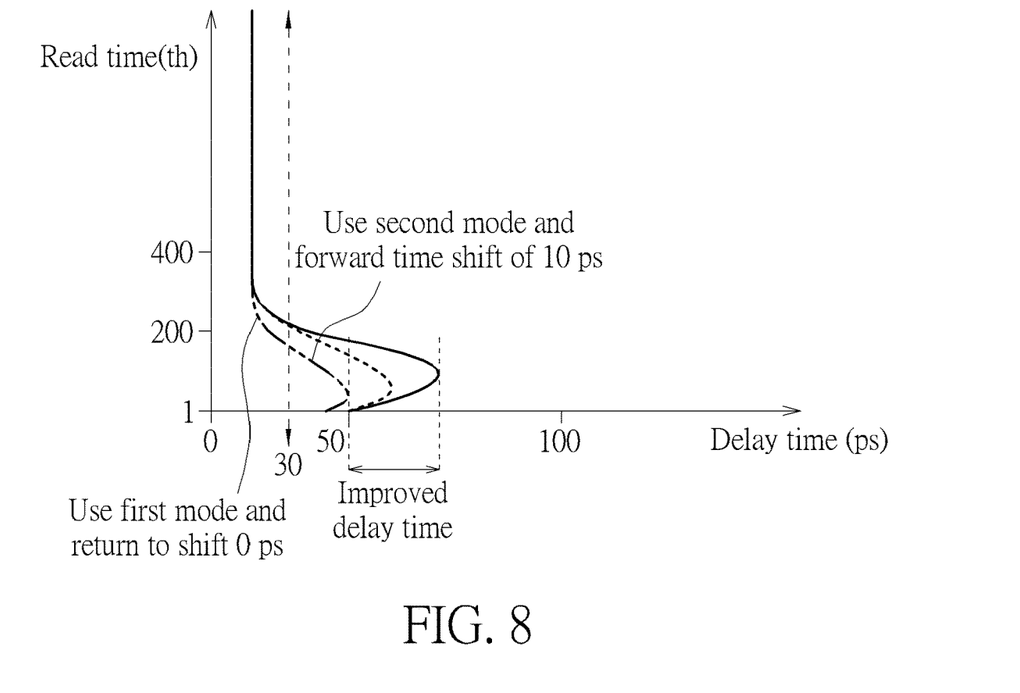
FIG. 8 is a waveform diagram illustrating a delayed clock signal output by the DLL circuit in different modes and being shifted according to the second embodiment of the present invention.

The counting control circuit 16 in the second mode may reduce the delay time very quickly. The DLL circuit 50 of the present invention can further perform a shift operation on the delayed clock signal according to the time shift control signal through the data output control circuit 20, so as to reduce the delay time more quickly. Please refer to FIG. 8. FIG. 8 is a waveform diagram illustrating a delayed clock signal output by the DLL circuit 50 in different modes and being shifted according to the second embodiment of the present invention. As shown in FIG. 8, similarly, assuming that the external circuit starts to read data after a bank active command, the delayed clock signal is delayed from the reference clock signal for a longer period of time (e.g., 80 picoseconds). FIG. 8 shows the difference between the DLL circuit 50 using the first mode, the second mode and the second mode with forward shifting of 10 picoseconds. For example, when the DLL circuit 50 receives a read start command, the counting control circuit 16 is controlled to be in the second mode, and sends the time shift control signal to the data output control circuit 20 for enabling a shifting operation. In the present embodiment, the data output control circuit 20 applies a forward time shift of 10 picoseconds (i.e. a delay of −10 picoseconds) to the delayed clock signal, but the present invention is not limited thereto. In addition, the length of the shifting may be determined according to requirements. Compared with using the second mode without shifting, using the second mode with a forward time shift of 10 picoseconds can gradually lock the delay time of the delayed clock signal with a smaller number of reading times. In other words, when the counting control circuit 16 is controlled to be in the second mode and the data output control circuit 20 shifts the delay clock signal forward by 10 picoseconds, the delay time can be reduced more quickly, in order to reduce the delay time after receiving the read start command. As a result, the eye diagram of the output data is better due to the improved delay time. In addition, when the delay time of the delayed clock signal is less than the predetermined time (e.g., 30 picoseconds), the counting control circuit 16 is controlled to be in the first mode, and the counting control circuit 16 sends the time shift control signal to the data output control circuit 20, in order to delay the delayed clock signal by 10 picoseconds, such that the shift delay state of the delayed clock signal is 0 picoseconds. As a result, the delay lock of the final delayed clock signal can be maintained without shifting.

According to the above arrangement of the second embodiment, the counting control circuit of the DLL circuit of the present invention has multiple modes (which include a first mode and a second mode). When reading data starts and a longer period of delay time occurs, the DLL circuit can quickly lock the delay through the second mode, and after the delay is less than a predetermined time, the DLL circuit can switch to the first mode to reduce the delay jittering that is not conducive for reading data. Furthermore, when the DLL circuit is in the second mode, it can also be used to receive a time shift control signal to accelerate the delay locking procedure through a delay signal shift operation, and perform a compensation operation on the delay signal shift operation when switching to the first mode. According to the arrangement, the DLL circuit of the present invention can achieve a faster delay lock after the data starts being read, in order to improve the eye diagram of the output data and effectively reduce the delay jittering.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay-locked loop (DLL) circuit, comprising:
   a delay circuit, configured to receive a reference clock signal from outside of the DLL circuit, and delay the reference clock signal to output a delayed clock signal;
   a phase detector, configured to receive the reference clock signal and the delayed clock signal, and detect a phase difference between the reference clock signal and the delayed clock signal to generate a phase difference signal; and
   a counting control circuit, configured to receive the phase difference signal and generate a control delay signal according to the phase difference signal;
   wherein the delay circuit delays the reference clock signal according to the control delay signal to output the delayed clock signal;
   wherein the counting control circuit has a first mode and a second mode, when the counting control circuit is in the first mode, the counting control circuit has a first update frequency, when the counting control circuit is in the second mode, the counting control circuit has a second update frequency, and the first update frequency is lower than the second update frequency.

2. The DLL circuit of claim 1, wherein the delay circuit comprises:
   a delay-locked loop delay circuit, configured to receive the control delay signal and delay the reference clock signal according to the control delay signal; and
   a data output control circuit, configured to output the delayed clock signal.

3. The DLL circuit of claim 1, wherein when the DLL circuit receives a locking command, the counting control circuit is controlled to be in the second mode, such that the counting control circuit has the second update frequency.

4. The DLL circuit of claim 1, wherein when the DLL circuit receives a read starting command, the counting control circuit is controlled to be in the first mode, such that the counting control circuit has the first update frequency.

5. The DLL circuit of claim 1, wherein when the counting control circuit is in the first mode, the counting control circuit has a first delay step; when the counting control circuit is in the second mode, the counting control circuit has a second delay step; and the first delay step is not greater than the second delay step.

6. The DLL circuit of claim 5, wherein when the DLL circuit receives a locking command, the counting control circuit is controlled to be in the second mode, such that the counting control circuit has the second delay step.

7. The DLL circuit of claim 5, wherein when the DLL circuit receives a read starting command, the counting control circuit is controlled to be in the first mode, such that the counting control circuit has the first delay step.

8. The DLL circuit of claim 5, wherein the counting control circuit further has a third mode, when the counting control circuit is in the third mode, the counting control circuit has a third update frequency and a third delay step; and at least one of the third update frequency and the third delay step is different from the first update frequency, the second update frequency and the first delay step and the second delay step.

9. The DLL circuit of claim 8, wherein when the DLL circuit receives a standby command, the counting control circuit is controlled to be in the third mode, such that the counting control circuit has the third update frequency and the third delay step.

10. The DLL circuit of claim 1, further comprising:
    an auxiliary phase detector, configured to receive the delayed clock signal delayed by a predetermined time, and detect the delayed clock signal delayed by the predetermined time to generate a determining signal;
    wherein the counting control circuit is further configured to generate the control delay signal according to the phase difference signal and the determining signal, and switch between the first mode and the second mode according to the phase difference signal and the determining signal.

11. The DLL circuit of claim 10, wherein the delay circuit comprises:
    a delay-locked loop delay circuit, configured to receive the control delay signal and delay the reference clock signal according to the control delay signal; and
    a data output control circuit, configured to output the delayed clock signal.

12. The DLL circuit of claim 11, wherein the counting control circuit is further configured to send a time shift control signal to the data output control circuit to control the data output control circuit to perform a shifting operation on the delayed clock signal.

13. The DLL circuit of claim 12, wherein when the counting control circuit is in the first mode, the time shift control signal is not sent; and when the counting control circuit is in the second mode, the time shift control signal is sent to control the data output control circuit to perform the shifting operation on the delayed clock signal.

14. The DLL circuit of claim 10, wherein when the DLL circuit receives a read starting command, the counting control circuit is controlled to be in the second mode, such that the counting control circuit has the second update frequency.

15. The DLL circuit of claim 10, wherein when the phase difference between the reference clock signal and the delayed clock signal is less than the predetermined time, the DLL circuit receives a consecutive reading command and the counting control circuit is controlled to be in the first mode, such that the counting control circuit has the first update frequency.

16. The DLL circuit of claim 10, wherein when the counting control circuit is in the first mode, the counting control circuit has a first delay step; when the counting control circuit is in the second mode, the counting control circuit has a second delay step; and the first delay step is not greater than the second delay step.

17. The DLL circuit of claim 16, wherein when the DLL circuit receives a read starting command, the counting control circuit is controlled to be in the second mode, such that the counting control circuit has the second delay step.

18. The DLL circuit of claim 16, wherein when the phase difference between the reference clock signal and the delayed clock signal is less than the predetermined time, the DLL circuit receives a consecutive reading command and the counting control circuit is controlled to be in the first mode, such that the counting control circuit has the first delay step.

19. The DLL circuit of claim 10, further comprising:
a command detector, electrically connected to the counting control circuit, and configured to detect a read starting command from outside of the DLL circuit;
wherein when the command detector detects the read starting command, the counting control circuit is controlled to be in the second mode, such that the counting control circuit has the second update frequency.

20. The DLL circuit of claim 10, further comprising:
a delay element, configured to delay the delayed clock signal for the predetermined time.

\* \* \* \* \*